United States Patent
Iwata et al.

(10) Patent No.: US 6,841,031 B2
(45) Date of Patent: Jan. 11, 2005

(54) SUBSTRATE PROCESSING APPARATUS EQUIPPING WITH HIGH-PRESSURE PROCESSING UNIT

(75) Inventors: Tomomi Iwata, Kyoto (JP); Yusuke Muraoka, Kyoto (JP); Kimitsugu Saito, Kyoto (JP); Ikuo Mizobata, Kyoto (JP); Takashi Miyake, Kyoto (JP); Ryuji Kitakado, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 0 days.

(21) Appl. No.: 10/201,383

(22) Filed: Jul. 23, 2002

(65) Prior Publication Data

US 2003/0019578 A1 Jan. 30, 2003

(30) Foreign Application Priority Data

Jul. 27, 2001 (JP) .......................... 2001-227242

(51) Int. Cl.[7] ...................... H01L 21/306; H01L 21/304
(52) U.S. Cl. ................... 156/345.22; 118/719
(58) Field of Search ................ 156/345.22, 345.23; 414/935–940, 788.7; 118/719; 134/113

(56) References Cited

U.S. PATENT DOCUMENTS

| | | | |
|---|---|---|---|
| 5,700,379 A | | 12/1997 | Biebl .............................. 216/2 |
| 6,074,515 A | * | 6/2000 | Iseki et al. .............. 156/345.23 |
| 6,270,619 B1 | * | 8/2001 | Suzuki et al. ........... 156/345.22 |
| 6,354,794 B2 | * | 3/2002 | Sato et al. ................... 414/811 |
| 6,413,355 B1 | * | 7/2002 | Kamikawa et al. ..... 156/345.11 |
| 6,439,824 B1 | * | 8/2002 | Harris et al. ............ 414/416.03 |
| 6,524,429 B1 | * | 2/2003 | Nogami et al. ......... 156/345.11 |

FOREIGN PATENT DOCUMENTS

| | | |
|---|---|---|
| DE | 19506404 | 3/1996 |
| EP | 0732557 | 9/1996 |
| JP | 7-142355 | 6/1995 |
| JP | 8-250464 | 9/1996 |
| JP | 9-139374 | 5/1997 |
| JP | 28299009 | 12/1998 |
| JP | 11-145351 | 5/1999 |
| JP | 2000-91180 | 3/2000 |
| JP | 2000-138156 | 5/2000 |

* cited by examiner

*Primary Examiner*—Gregory Mills
*Assistant Examiner*—Sylvia R. MacArthur
(74) *Attorney, Agent, or Firm*—Ostrolenk, Faber, Gerb & Soffen, LLP (57) ABSTRACT

With respect to any one of processing units, a main transportation path, a developing unit, a dedicated transportation robot and a high-pressure processing unit are disposed linearly in this order in a direction. Hence, even if a processing fluid adhering to a substrate or an evaporant of the processing fluid moves toward the main transportation path while the high-pressure processing unit transports the substrate wet with the processing fluid, there are the processing units located which the processing fluid or its evaporant must arrive at before reaching the main transportation path.

21 Claims, 9 Drawing Sheets

SUBSTRATE PROCESSING APPARATUS EQUIPPING WITH HIGH-PRESSURE PROCESSING UNIT

BACKGROUND OF THE INVENTION

1. Field of the Invention

The present invention relates to a substrate processing apparatus which performs a variety types of surface treatments (e.g., development, etching, cleaning, rinsing, drying) upon a variety types of substrates such as a semiconductor wafer, a glass substrate for photomask, a glass substrate for liquid crystal display, a glass substrate for plasma display and an optical disk substrate (hereinafter simply referred to as "substrates").

2. Description of the Related Art

Figure 9:
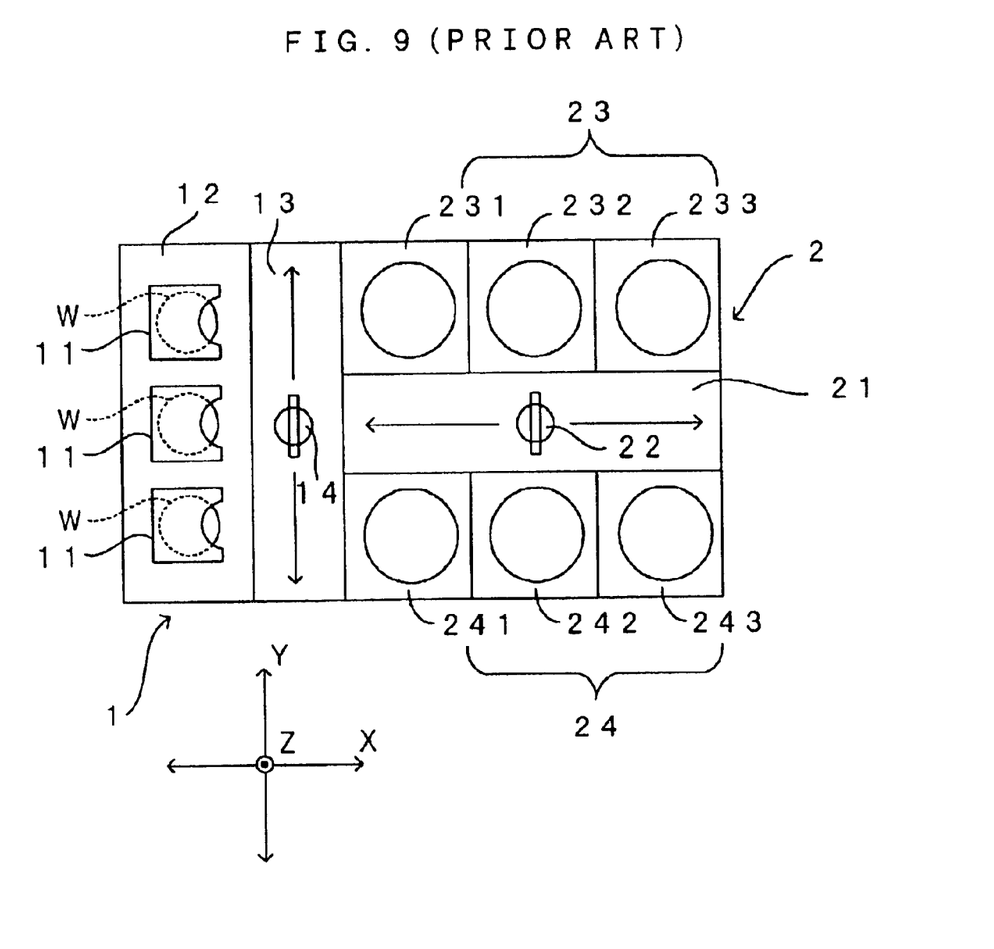
FIG. 9 is a drawing which shows a conventional substrate processing apparatus.

A substrate processing apparatus which is shown in FIG. 9, for instance, has been proposed as this type of substrate processing apparatus. Disposed in the illustrated substrate processing apparatus are an indexer 1 and a processing module 2 which is disposed adjacent to and on one side to the indexer 1. The indexer 1 comprises a cassette mounting stage 12 which mounts a plurality of cassettes 11 each capable of housing more than one substrates W, and an indexer robot 14 which can move on an indexer transportation path 13 extending long along a direction Y. The index robot 14 loads the substrates W into and unloads the substrates W out from the cassettes 11. The processing module 2 comprises a main transportation robot 22 which can move on a main transportation path 21 which extends long along a direction X perpendicular to the direction Y, and unit columns 23, 24 which are disposed on the both sides of the main transportation path 21. In the unit columns 23, 24, processing units 231 through 233 and 241 through 243 are respectively arranged in the direction X.

In the substrate processing apparatus having such a structure above, after unloaded by the indexer robot 14, the substrates W housed in the cassettes 11 are handed over to the main transportation robot 22. Receiving the substrates W yet to be processed, the main transportation robot 22 moves to arrive at any one of the processing units 231 through 233 and 241 through 243, and inserts the substrates W to this processing unit. Meanwhile, the processed substrates W are unloaded from this processing unit by the main transportation robot 22 and thereafter transported to the next processing unit.

After such an operation is repeated and a series of processing is performed upon the substrates W, the main transportation robot 22 moves on the main transportation path 21 while still holding the substrates W, and hands over the substrates W to the indexer robot 14. The indexer robot 14 puts the received substrates W into the cassettes 11 which used to originally house these substrates. This structure allows the main transportation robot 22 to access the processing units 231 through 233 and 241 through 243 in any desired order, and therefore, an order in which the processing is to be performed upon the substrates W can be freely set.

By the way, while the sizes of patterns of semiconductor devices have been rapidly reduced over the recent years, these endeavors have led to a new problem to processing of substrates. For instance, when a resist applied on a substrate W is to be patterned in order to create fine patterns, a development process, a rinsing process and a drying process are executed one after another. A developing fluid such as an alkaline solution is used during the development process for developing the resist applied on the substrate W and accordingly removing an unnecessary amount of the resist, a rinsing fluid such as deionized water is used during the rinsing process for removing the developing fluid as it is after the development process, and during the drying process, centrifugal force acts upon the rinsing fluid which remains on the substrate W and the rinsing fluid is removed from the substrate W to dry (spin drying process). During the drying process among these processes, if the interface between the rinsing fluid and a gas appears on the substrate W as drying proceeds and if this interface shows itself in a gap between the fine patterns of the semiconductor device, the surface tension of the rinsing fluid pulls the fine patterns toward each other and accordingly destroys the fine patterns, which is a problem.

A few solutions to this problem have been studied, one of which is to form all or some of the processing units 231 through 233 and 241 through 243 by the apparatus described in Japanese Patent Application Laid-Open Gazette No. H8-250464 (hereinafter referred to as "the proposed apparatus"). The proposed apparatus continuously executes a wet surface treatment, in which a substrate W transported as it is housed in a container is processed within the container a wet surface treatment (wet process) with a liquid-state chemical agent, and a supercritical drying process. The continuous processing is carried out within the same apparatus as described below.

First, the main transportation robot 22 loads the substrates W into the container. After the developing fluid is supplied and a development process is carried out, a rinsing process with deionized water and a substitution process with a substitution fluid containing alcohol are executed in this order as a wet process. Following this, liquid-state carbon dioxide is introduced into the container to substitute alcohol, the temperature is increased after the substitution with liquid-state carbon dioxide to force carbon dioxide into a supercritical state, and the pressure is then reduced, thereby executing supercritical drying. Execution of supercritical drying in this manner prevents destruction of fine patterns.

However, in the event that all or some of the processing units are formed by the proposed apparatus, there are following problems. First, the processing units using a supercritical fluid are under more restricting conditions as compared to frequently used conventional processing units, i.e., processing units which execute surface treatments under an atmospheric pressure. In other words, a corrosive chemical agent, such as strong acid and strong alkali, can not be introduced for execution of surface treatments although a pressure vessel needs be used as the container, and therefore, the range of selection of chemical agents is drastically restricted. This is because a pressure vessel is mainly made of a metallic material considering the resistance against pressure and because strong acid or alkali corrodes a surface of the pressure vessel which is exposed to a chemical fluid. While an obvious solution is to coat an inner surface of the pressure vessel with a corrosion-resistant coat such as a fluorocarbon resin, it is virtually difficult to keep the coating continuously exhibiting this function under a high pressure over a long period of time. Further, even if the inner surface of the pressure vessel is coated with a corrosion-resistant coat, it is very difficult to coat inner surfaces of all parts and components, such as a small pipe, a joint and a high-pressure valve, leading to the inner surface of the pressure vessel with a corrosion-resistant coat.

An approach to solve this problem may be to distinguish a wet surface treatment, which causes a problem in terms of corrosion resistance, from a surface treatment which uses a supercritical fluid. In other words, the former (wet surface treatment) may be executed with the conventional processing units while the latter (supercritical surface treatment) may be executed with processing units which are formed by the proposed apparatus. However, such a structure leads to the following problem.

First, in the substrate processing apparatus shown in FIG. 9, the proposed apparatus is used as some of the processing units of the substrate processing apparatus and a wet surface treatment which causes a problem in terms of corrosion resistance is executed by the conventional processing units. As is clear from FIG. 9, a processing unit for executing the wet surface treatment (hereinafter referred to as a "wet processing unit") and a processing unit which is formed by the proposed apparatus (hereinafter referred to as a "high-pressure processing unit") are both disposed facing the main transportation path 21. Therefore, it is necessary for the main transportation robot 22 to transport the substrates W from the wet processing unit to the high-pressure processing unit. In this manner, since the substrates W as they are immediately after treated with the wet surface treatment by the wet processing unit are wet with a processing fluid such as a rinsing fluid and a substitution fluid, the main transportation robot 22 directly touches the substrates W in such a condition. During this wet transportation, a substrate holding portion (not shown) of the main transportation robot 22 therefore gets wet with the processing fluid. As a result, as other dried substrates are held in the substrate holding portion which is thus wet, these substrates get wet once again, which in turn causes a problem that a production yield decreases.

Further, while another approach is to dispose a dedicated transportation robot between the wet processing unit and the high-pressure processing unit, since the both processing units are arranged facing the main transportation path 21, the dedicated transportation robot as well needs inevitably be disposed close to the main indexer transportation path. Hence, during wet transportation of the substrates W by the dedicated transportation robot from the wet processing unit to the high-pressure processing unit, the main transportation robot 22 gets wet or contaminated as the processing fluid or the like adhering to the substrates W splashes around toward the main transportation path 21 or as the processing fluid partially evaporates and accordingly leaks out toward the main transportation path 21, thereby leading to a decrease in production yield in a similar fashion to the above.

SUMMARY OF THE INVENTION

A main object of the present invention is to ensure, within a substrate processing apparatus in which main transportation means transports a substrate to be processed with a processing fluid, prevention of wetting or contamination of the main transportation means with the processing fluid.

The present invention is directed to a substrate processing apparatus which includes a main transportation path. The apparatus comprises: a wet processing unit which is disposed facing the main transportation path, and which supplies a processing fluid to a substrate to process the substrate with a predetermined wet surface treatment; main transportation means which move on the main transportation path, and which loads a substrate into and unloads a substrate out from the wet processing unit; a high-pressure processing unit which is disposed away from the main transportation path with the wet processing unit located between the main transportation path and the high-pressure processing unit, and which causes a high-pressure fluid or a mixture of a high-pressure fluid and a chemical agent, as a processing fluid, to come into contact with a surface of a substrate treated with the wet surface treatment by the wet processing unit and accordingly processes a surface of the substrate with a high-pressure surface treatment; and dedicated transportation means which is disposed between the wet processing unit and the high-pressure processing unit, and which transports a substrate from the wet processing unit to the high-pressure processing unit.

The high-pressure fluid used in the present invention is preferably carbon dioxide because of its safety, price and the easiness in changing into a supercritical state. Other than carbon dioxide, water, ammonia, nitrogen monoxide, ethanol or the like may be used. The high-pressure fluid is used because of its high diffusion coefficient and its capability of extracting a dissolved contaminant in a medium, and further because the high-pressure fluid can further penetrate even through very fine patterns due to a property between gases and liquids. Further, the density of a high-pressure fluid is close to that of a liquid, and therefore, the high-pressure fluid can contain a far greater amount of an additive (chemical agent) than a gas can.

The high-pressure fluid referred to in the present invention is a fluid whose pressure is 1 MPa or more. The high-pressure fluid is preferably a fluid which is known to possess a high density, a high solubility, a low viscosity and a high diffusion capability, and further preferably a fluid which is in a supercritical or subcritical state. Carbon dioxide may be at 31 degrees Celsius and of 7.1 MPa or more to thereby bring carbon dioxide into a supercritical state. It is preferable to use a subcritical or supercritical fluid (high-pressure fluid) of 5 through 30 MPa at a rinsing step, a drying/developing step and the like during and after cleaning, and it is further preferable to perform these treatments at 7.1 through 20 MPa or less. Although the section DETAILED DESCRIPTION OF THE PREFERRED EMBODIMENTS below will describe an example that a drying process after a wet development process is executed as a surface treatment using the high-pressure fluid, a surface treatment is not limited only to a drying process.

The above and further objects and novel features of the invention will more fully appear from the following detailed description when the same is read in connection with the accompanying drawing. It is to be expressly understood, however, that the drawing is for purpose of illustration only and is not intended as a definition of the limits of the invention.

DETAILED DESCRIPTION OF THE PREFERRED EMBODIMENTS

Figure 1:
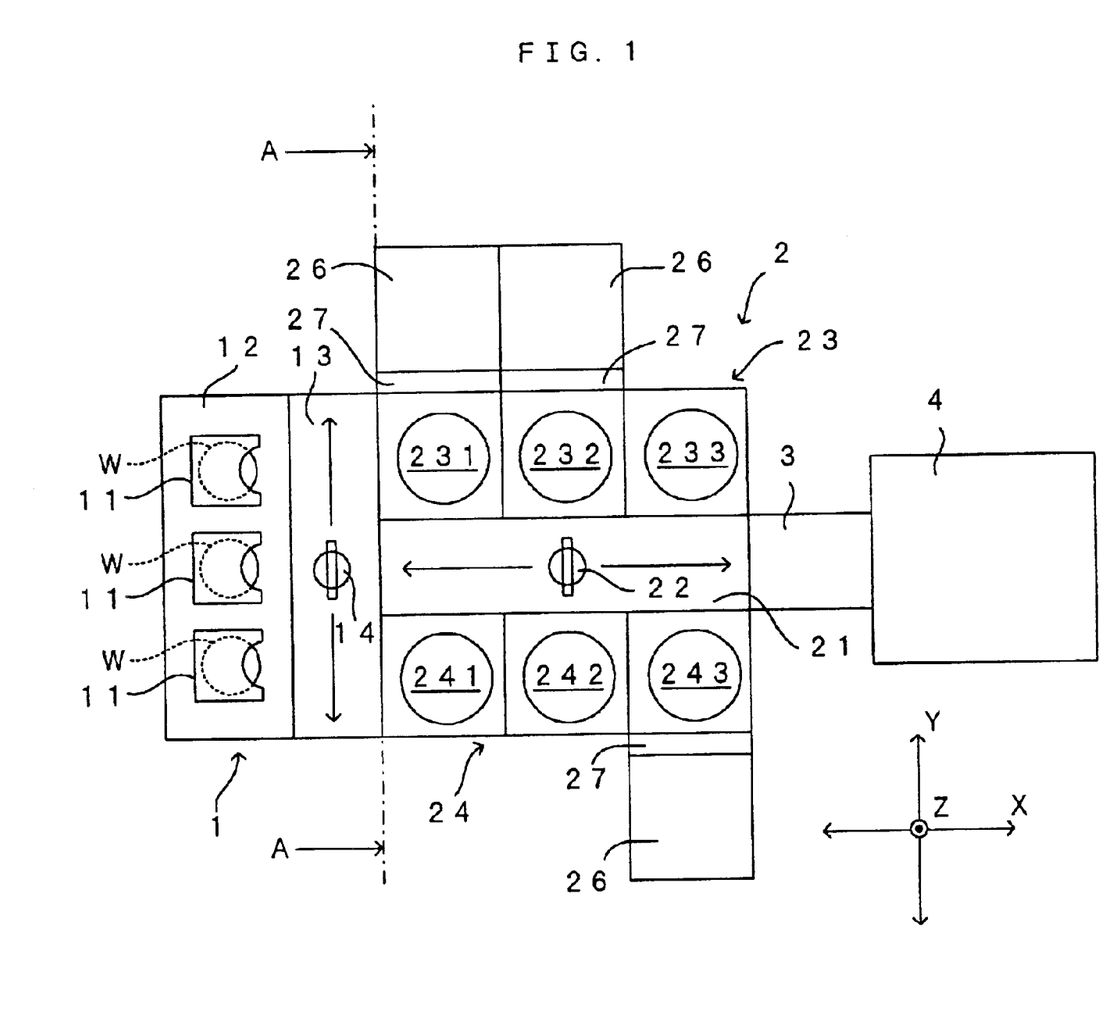
FIG. 1 is a drawing which shows a preferred embodiment of a substrate processing apparatus according to the present invention.
Figure 2:
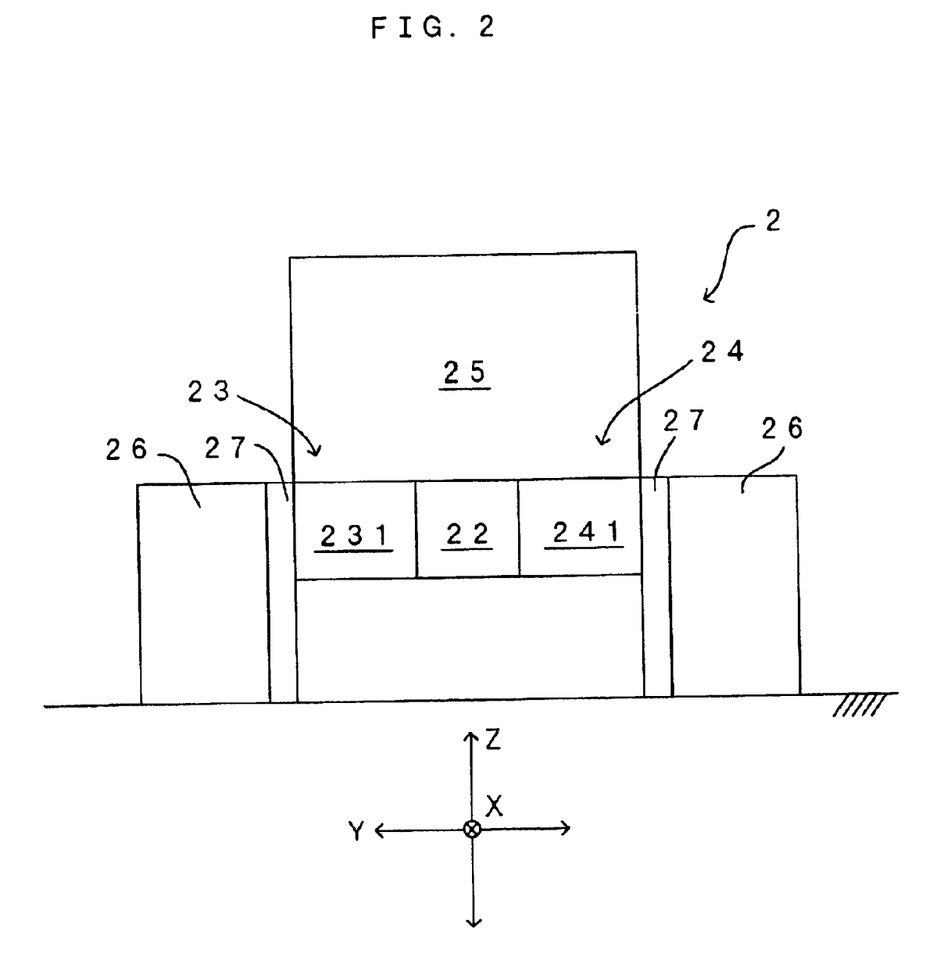
FIG. 2 is a drawing along the A—A line in FIG. 1.

FIG. 1 is a drawing which shows a preferred embodiment of a substrate processing apparatus according to the present invention. FIG. 2 is a drawing along the A—A line in FIG. 1. Disposed in this substrate processing apparatus are an indexer 1, a processing module 2 which is disposed adjacent to and on one side to the indexer 1, an interface 3 which is disposed adjacent to and on one side to the processing module 2, and an exposing unit 4 which is disposed adjacent to and on one side to the interface 3. Of these elements, the indexer 1 is exactly the same in structure to that of the conventional apparatus shown in FIG. 9, and therefore, the same structures will be denoted at the same reference symbols but will not be described again.

As in the conventional apparatus shown in FIG. 9, the processing module 2 comprises a main transportation robot 22 which can move on a main transportation path 21 which extends long along a direction X perpendicular to the direction Y, and unit columns 23, 24 which are disposed on the both sides of the main transportation path 21. In the unit columns 23, 24, processing units 231 through 233 and 241 through 243 are respectively arranged facing the main transportation path 21. According to this embodiment, the processing units 231, 232 and 243 are formed by developing units which perform a development process while the remaining processing units 233, 241 and 242 are formed by resist coating units which coat a resist to surfaces of substrates W.

Further, as shown in FIG. 2, at a position above the main transportation path 21 and the unit columns 23 and 24, a unit group 25 is disposed which is for heating, cooling and otherwise processing the substrates W.

There are a high-pressure processing unit 26 and a dedicated transportation robot 27 disposed for each one of the processing units 231, 232 and 243. In other words, the high-pressure processing unit 26 is disposed on the opposite side of the main transportation path 21 to the processing unit 231, while the dedicated transportation robot 27, which transports substrates W between the processing unit 231 and the high-pressure processing unit 26, is disposed between the processing units 231 and 26. In this manner, the main transportation path 21, the processing unit 231, the dedicated transportation robot 27 and the high-pressure processing unit 26 are disposed linearly in this order according to this embodiment. The high-pressure processing units 26 and the dedicated transportation robots 27 are disposed close to the remaining processing units 232 and 243 as well, in a similar manner to that regarding the processing unit 231.

Figure 3:
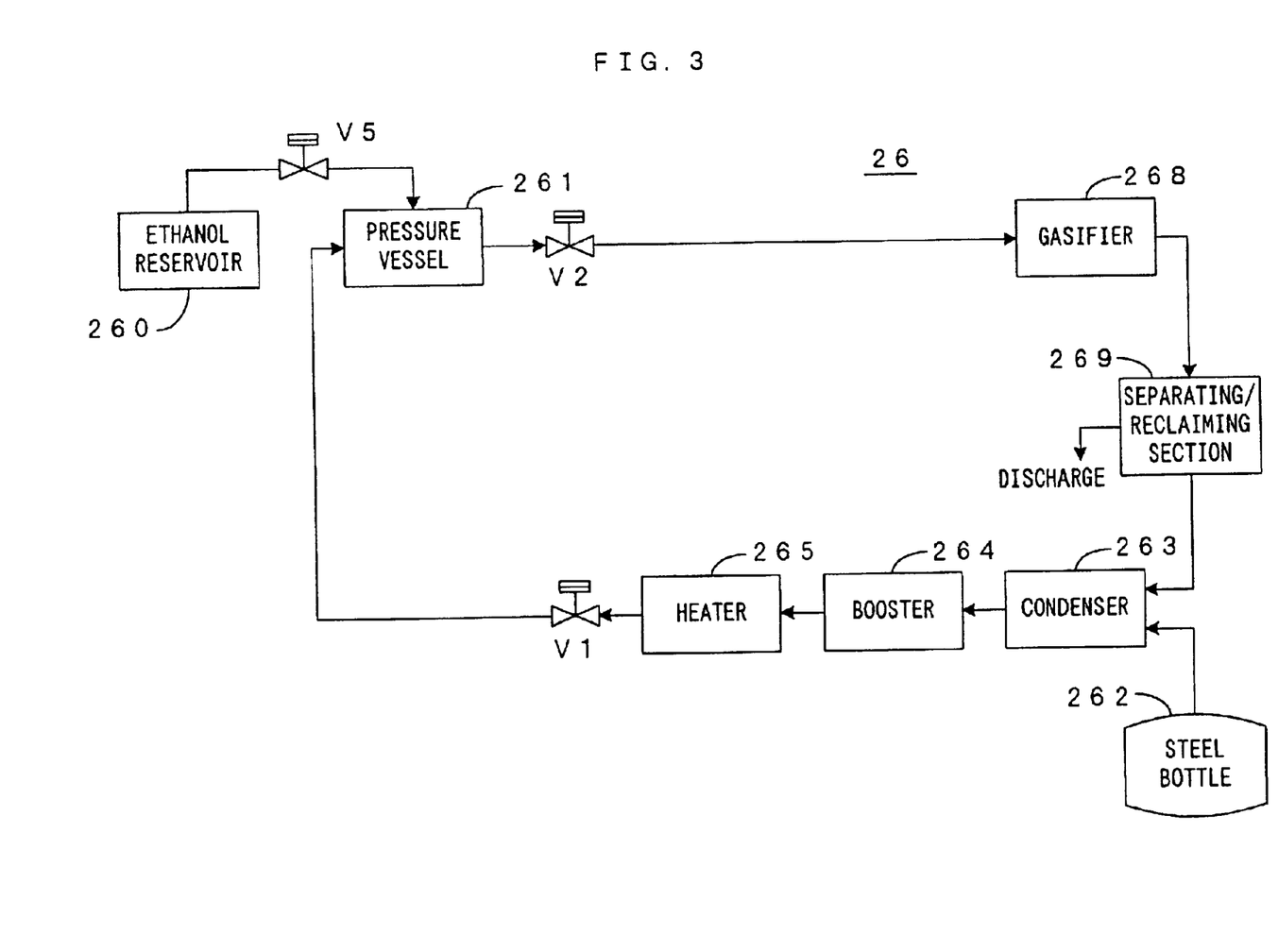
FIG. 3 is a block diagram showing a schematic structure of a high-pressure processing unit of the substrate processing apparatus shown in FIG. 1.

FIG. 3 is a block diagram showing a schematic structure of the high-pressure processing units of the substrate processing apparatus shown in FIG. 1. Such a high-pressure processing unit 26 is a unit which introduces ethanol as a substitution fluid from an ethanol reservoir 260 via a high-pressure valve V5 into a processing chamber which is formed inside a pressure vessel 261 to thereby perform alcohol substitution upon a substrate W which is held in the processing chamber and introduces supercritical carbon dioxide (high-pressure fluid) as a processing fluid to thereby execute a predetermined drying process upon alcohol-substituted substrate W.

The high-pressure processing unit 26 is structured such that while supercritical carbon dioxide is cyclically used, when carbon dioxide inside the system decreases as the processing chamber is opened to an atmospheric pressure or on other occasions, liquid carbon dioxide is supplied from a steel bottle 262. The steel bottle 262 is connected with a condenser 263 which is formed by a condenser and the like, so that liquid carbon dioxide is supplied into the system through the condenser 263. As described in detail later, the condenser 263 condenses and liquefies carbon dioxide which is to be cyclically used in the system.

A booster 264 such as a pressure pump is connected to the output side of the condenser 263, and therefore, high-pressure liquid carbon dioxide is obtained as liquid carbon dioxide is pressurized in the booster 264, and high-pressure liquid carbon dioxide is sent under pressure to the pressure vessel 261 via a heater 265 and a high-pressure valve V1.

High-pressure liquid carbon dioxide thus sent under pressure is heated by the heater 265 to a temperature which is suitable to a surface treatment (drying), accordingly becomes supercritical carbon dioxide and is then sent to the pressure vessel 261 via the high-pressure valve V1.

A substrate holder (not shown) is disposed inside the pressure vessel 261 to hold the substrates W. After a gate valve (not shown) disposed in a side surface portion of the pressure vessel 261 is opened and the dedicated transportation robot 27 loads one substrate W yet to be processed into the substrate holder via the gate valve, the gate valve is closed and the surface treatment is carried out as described in detail later. Meanwhile, after the surface treatment, the gate valve is opened and the dedicated transportation robot 27 unloads the processed substrate W. Thus, the high-pressure processing unit 26 is a unit of the so-called single wafer type which holds one substrate W at a time and performs a predetermined surface treatment.

Further, in the pressure vessel 261, thus fed processing fluid is let out toward a surface of the substrate W which is held in the substrate holder. As a result, the processing fluid contacts the substrate W and the surface treatment for the surface of the substrate W is executed.

In addition, an exhaust port (not shown) is disposed to the pressure vessel 261, so that the processing fluid or a contaminant which is generated through a surface treatment inside the processing chamber can be discharged outside the pressure vessel 261. A gasifier 268 formed by a decompressor or the like is connected to the exhaust port via a high-pressure valve V2, and through a decompression process, the fluid discharged from the processing chamber through the exhaust port is completely gasified and fed to a separating/reclaiming portion 269. The separating/reclaiming section 269 performs gas-liquid separation, thereby obtaining carbon dioxide as a gas component and a chemical fluid component as a liquid component. The separating/reclaiming section 269 may be a variety types of apparatuses capable of executing gas-liquid separation, such as simple distillation, distillation (fraction) and flash separation, a centrifugal machine, etc.

Thus, this embodiment requires the gasifier 268 to completely gasify the fluid discharged from the processing chamber before the fluid is fed to the separating/reclaiming section 269. This is for the case that the purpose of improving the separation efficiency and the efficiency of recycling carbon dioxide in the separating/reclaiming section 269, for the decompressed fluid such as carbon dioxide becomes a mixture of a gas-like fluid (carbonic acid gas) and a liquid-like fluid (liquefied carbon dioxide) because of a relationship with a temperature is though about.

The liquid (or solid) component comprised of the chemical fluid component separated in the separating/reclaiming section 269 is discharged from the separating/reclaiming section 269, and post-processed in accordance with necessity. On the other hand, carbon dioxide which is the gas component is supplied to the condenser 263 to be re-used. Although this embodiment is directed to the structure that carbon dioxide is re-used, carbon dioxide may be discharged from the separating/reclaiming section 269 if carbon dioxide is to be disposed without re-used.

Operations of the substrate processing apparatus having such a structure as above will now be described. After transported by the indexer robot 14, the substrate W housed in the cassettes 11 is handed over to the main transportation robot 22. Receiving the substrate W, the main transportation robot 22 moves to arrive at the interface 3 or any one of the processing units 231 through 233 and 241 through 243 and the processing units which form the unit group 25, and inserts the substrate W. After processed, the substrate W is unloaded by the main transportation robot 22 and transported to the next processing unit or the interface 3. Noting one substrate W, the order of transportation in which the main transportation robot 22 transports the substrates are as follows:

(1) the resist coating unit: resist coating
(2) the heating unit in the unit group 25: baking
(3) the cooling unit in the unit group 25: cooling
(4) the interface 3: transfer of the substrate to the exposing unit
(5) the heating unit in the unit group 25: baking
(6) the cooling unit in the unit group 25: cooling
(7) the developing unit: development
(8) the heating unit in the unit group 25: post-baking
(9) the cooling unit in the unit group 25: cooling This is merely one example of the processes. The substrates may be transported and processed through other processes.

By the way, as the substrate W transported by the main transportation robot 22 arrives at the processing units 231, 232 and 243, a developing fluid is supplied upon the surface of the substrate W and the development process is initiated as in the conventional apparatus. Thus, in this embodiment, the developing unit corresponds to a "wet processing unit" of the present invention. Further, in this embodiment, the dedicated transportation robot 27 which corresponds to "dedicated transportation means" of the present invention retrieves the substrate W which is already completely through the development process and the subsequent rinsing process from the developing unit at proper timing without any relevancy to the operations of the main transportation robot 22, and loads the substrate W which now seating a processing fluid (mainly the rinsing fluid) into the high-pressure processing unit 26 which is associated with the developing unit.

The high-pressure processing unit 26 thus receiving the substrate W is an apparatus in which a controller controls the respective portions of the apparatus and a drying process is carried out as a high-pressure process in accordance with a program stored in a memory (not shown) of the controller in advance. Operations of the high-pressure processing unit 26 is as follows.

First, the gate valve disposed in the side surface portion of the pressure vessel 261 is opened. One substrate W yet to be processed is loaded in by the dedicated transportation robot 27 through the gate valve, and as the substrate W is placed on the substrate holder, the substrate holder holds the substrate W. As holding of the substrate is completed and the dedicated transportation robot 27 retreats from the processing chamber, the gate valve is closed and the high-pressure process is carried out.

Since the substrate W held by the substrate holder is already through the rinsing process with deionized water in the developing unit, the surface of the substrate W is wet with deionized water. Noting this, this embodiment requires to introduce ethanol as a substitution fluid into the processing chamber from the ethanol reservoir 260 and perform alcohol substitution.

After substitution, supercritical carbon dioxide is supplied inside the pressure vessel 261. In other words, liquefied carbon dioxide within the system is pressurized in the booster 264 to generate high-pressure liquefied carbon dioxide, and high-pressure liquefied carbon dioxide is heated in the heater 265, whereby supercritical carbon dioxide is generated.

Supercritical carbon dioxide is expelled upon the surface of the substrate W which is held by the substrate holder, and a predetermined drying process is carried out with supercritical carbon dioxide in contact with the surface of the substrate W. During the drying step, the high-pressure valve V2 located on the downstream side to the processing chamber remains closed. Alternatively, the high-pressure valve V2 may be structured so as to serve as a pressure adjustment valve which remains open to an adjusted extent such that the pressure inside the pressure vessel 261 will stay at a predetermined pressure.

Through this high-pressure process, the processing fluid component (mainly the rinsing fluid) which used to wet the substrate W gets diffused and dissolved in supercritical carbon dioxide which exists within the processing chamber.

As the drying process completes in a predetermined period of time, the fluid in the processing chamber is discharged. To this end, supercritical carbon dioxide may be supplied with the high-pressure valves V1, V2 open so that the fluid will be pushed out, or the fluid may be discharged with the high-pressure valve V1 close but the high-pressure valve V2 open.

Following this, the high-pressure valve V1 is closed and decompression is executed, and when the processing chamber returns to the atmospheric pressure, the gate valve disposed in the side surface portion of the pressure vessel 261 is opened. The dedicated transportation robot 27 then unloads the processed substrate W through the gate valve, and the series of processing (drying process) completes.

The substrate W thus unloaded from the high-pressure processing unit 26 is transferred to the main transportation robot 22, without loaded into and processed in the processing units 231, 232 or 234.

As described above, according to the embodiment, with respect to any one of the processing units 231, 232 and 243, the main transportation path 21, the processing unit (231, 232 or 243), the dedicated transportation robot 27 and the high-pressure processing unit 26 are disposed linearly in this order in the direction Y. Hence, the three dedicated transportation robots 27 are away from the main transportation path 21, with the processing units 231, 232 and 243 respectively located between the robots 27 and the main transportation path 21. With this arrangement, during transportation of the substrate W whose surface is wet with the processing fluid to the high-pressure processing units 26, even if the processing fluid adhering to the substrate W splashes toward the main transportation path 21 or even if the processing fluid partially evaporates and leaks toward the main transportation path 21, there are the processing units 231, 232 and 243 located which the processing fluid must arrive at before reaching the main transportation path 21. As a result, it is possible to effectively prevent the main transportation robot 22 which is disposed on the main transportation path 21 from getting contaminated.

In addition, according to the embodiment above, the main transportation path 21, the processing unit 231, 232 or 243, the dedicated transportation robot 27 and the high-pressure processing unit 26 are disposed linearly in this order so that the processing units 231, 232 and 243 are each positioned on the shortest courses between the associated dedicated transportation robots 27 and the main transportation path 21, and therefore, contamination of the main transportation robot 22 due to the processing units 231, 232 and 243 is effectively prevented.

The conventional techniques demand time management considering the idle time of the main transportation robot 22 or the like for transportation of the substrates W by the main transportation robot 22 among all processing units. On the other hand, according to the embodiment above, since the dedicated transportation robots 27 are responsible for transportation of the substrates W from the processing units 231, 232 and 243 to the associated high-pressure processing units 26, it is possible to transport the substrates W from the processing units 231, 232 and 243 to the associated high-pressure processing units 26 at optimal timing for the development process without considering the idle time of the main transportation robot 22 or the like regarding the development process. Hence, it is possible to simplify the time management work.

The present invention is not limited to the embodiment described above, but may be modified in various fashions other than that described above to the extent not deviating from the purpose of the invention. For instance, although the embodiment described above is directed to an application of the present invention to a substrate processing apparatus in which the indexer transportation path 13 and the main transportation path 21 define a T-letter arrangement, the present invention is applicable to such a substrate processing apparatus shown in FIG. 4 or 5 in which a sub transportation path 28 is disposed other than the main transportation path 21.

Figure 4:
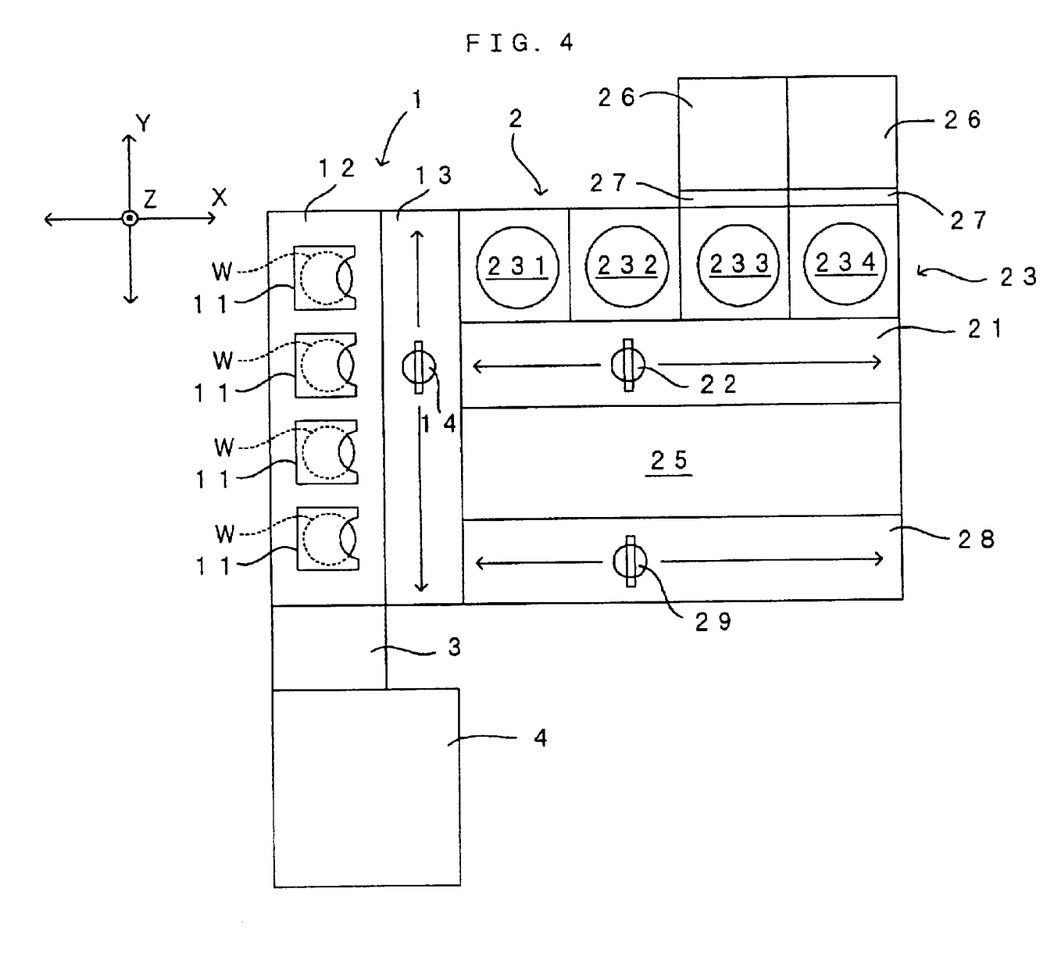
FIG. 4 is a drawing which shows other preferred embodiment of the substrate processing apparatus according to the present invention.
Figure 5:
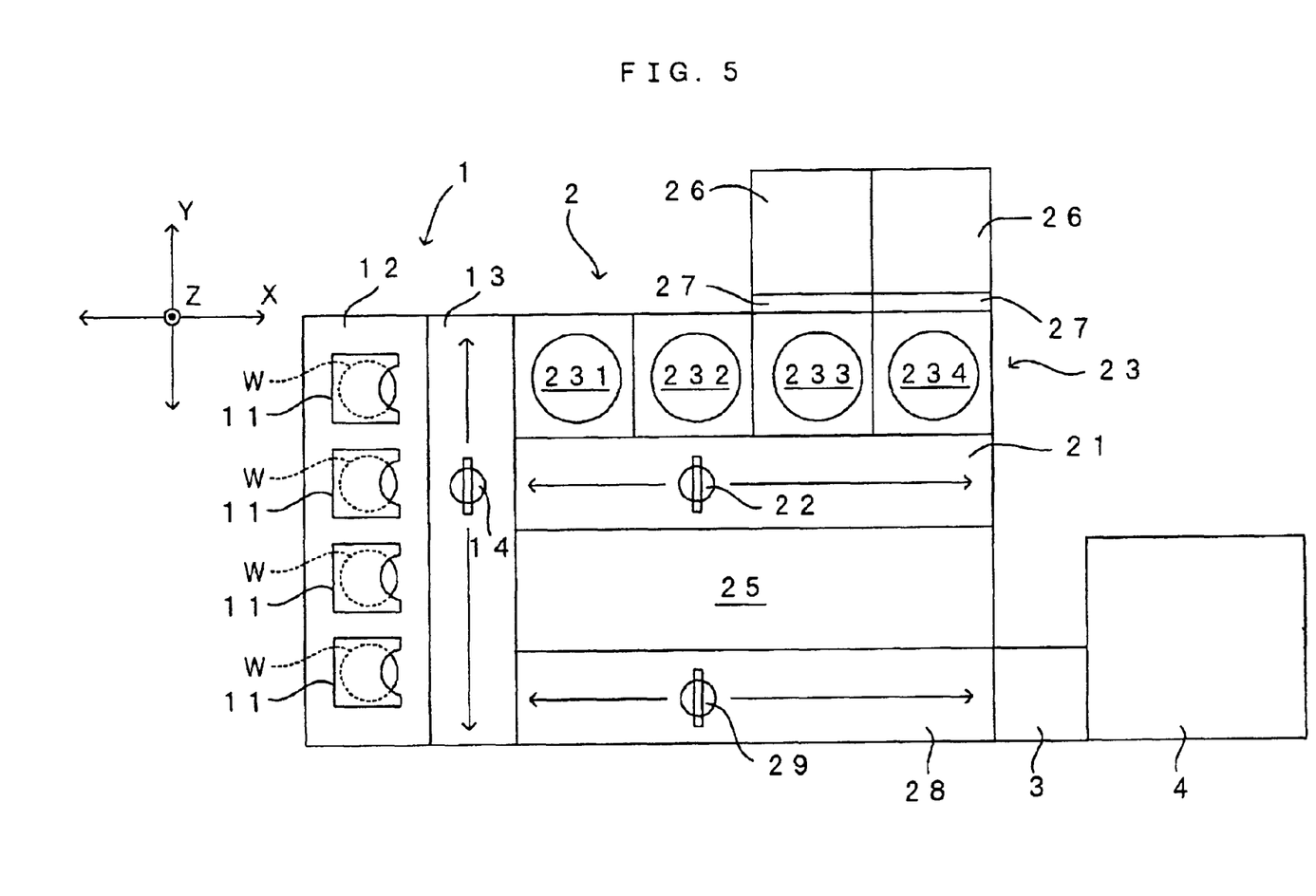
FIG. 5 is a drawing which shows another preferred embodiment of the substrate processing apparatus according to the present invention.
Figure 6:
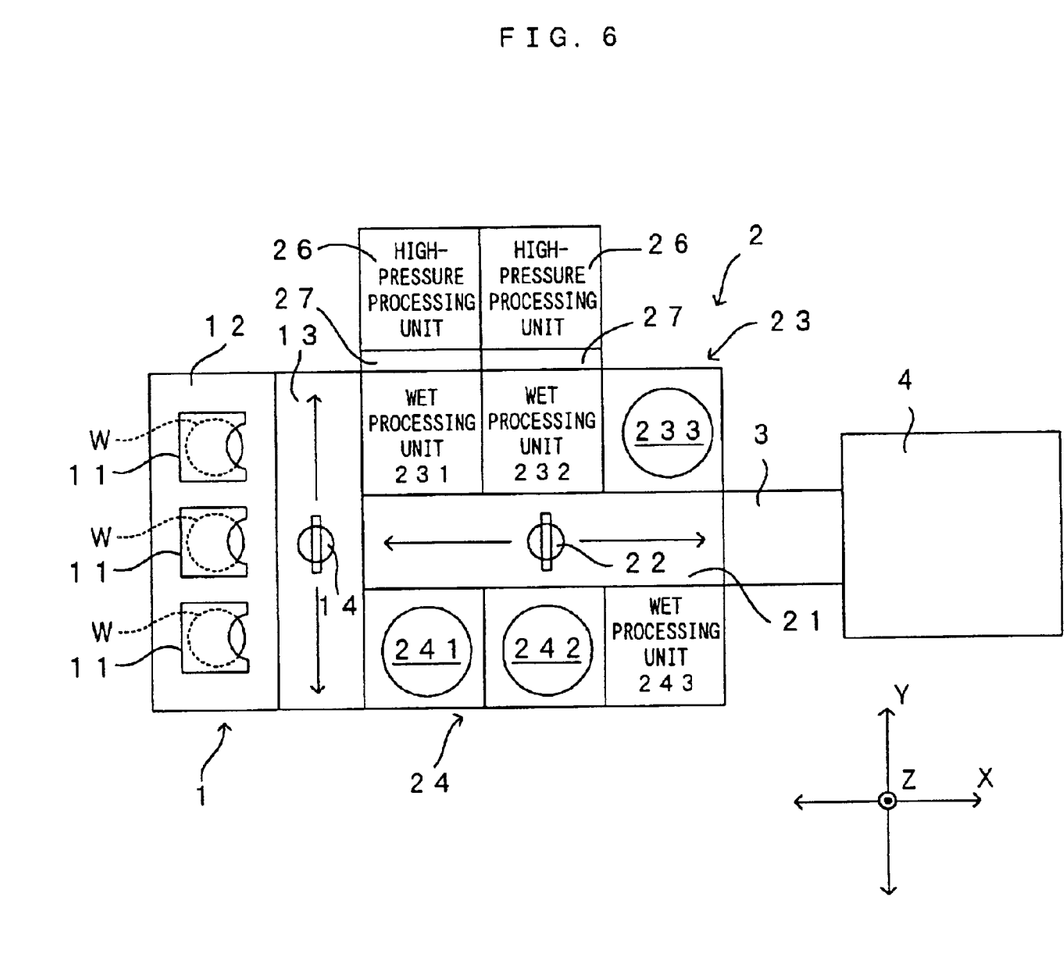
FIG. 6 is a drawing which shows further preferred embodiment of the substrate processing apparatus according to the present invention.

That is, in such a substrate processing apparatus, the two resist coating units 231 and 232 and the developing units 233 and 234 are disposed facing the main transportation path 21 on the direction Y side to the main transportation path 21, thereby forming the unit column 23, and the unit group 25 for heating, cooling and the like is disposed in an area which is between the main transportation path 21 and the sub transportation path 28. The main transportation robot 22 which moves on the main transportation path 21 in the direction X transports the substrates to the processing units 231 through 234 which belong to the unit column 23, whereas a sub transportation robot 29 which moves on the sub transportation path 28 in the direction X transports the substrates to the processing units which form the unit group 25.

In a substrate processing apparatus having such a structure above as well, the high-pressure processing units 26 are disposed on the opposite side of the main transportation path 21 to the processing units 233 and 234 and the dedicated transportation robots 27 are disposed between the processing units 233 and 234 and the associated high-pressure processing units 26, and hence, a similar effect to that according to the embodiment described above is realized.

Further, although the embodiment described above is an application of the present invention to a substrate processing apparatus which comprises a developing unit as the "wet processing unit" of the present invention, the present invention is not limited to such an application. The present invention is also applicable generally to a substrate processing apparatus comprising a wet processing unit, which performs a wet surface treatment such as etching and cleaning using a processing fluid such as an etching fluid and a cleaning fluid, and a high-pressure processing unit, which receives a substrate processed through the wet surface treatment by the wet processing unit and applies a surface treatment upon a surface of the substrate with the substrate brought in contact with a high-pressure fluid, thereby achieving a similar effect to that according to the preferred embodiment described above.

Any of a development processing unit, etching processing unit, cleaning processing unit, coating processing unit and the like may be used as the wet processing unit of the present invention. However, not all substrates, processed through the wet surface treatment by the wet processing unit, must be constantly processed through the surface treatment by the high-pressure processing unit. Therefore, a high-pressure processing unit may be disposed for the wet processing unit in accordance with necessity. For instance, in a substrate processing apparatus in FIG. 8, although a plurality of wet processing units 231, 232 and 233 are disposed on one side of a main transportation path 21, high-pressure processing units 26 are disposed only for two wet processing units 231 and 232. In this case, two wet processing units 231 and 232 perform as a preprocessing unit of the present invention. The present invention is applicable to a substrate processing apparatus having such a structure above as well, and a similar effect to that according to the embodiment described above is realized.

Applications of the present invention will now be described.

First, the present invention is applicable to a substrate processing apparatus which comprises the high-pressure processing unit which executes drying after wet-etching a micro-electro-mechanical system (MEMS) device for instance.

Second, the present invention is applicable to an apparatus in which a substrate already through a development process, e.g., development using an organic solvent, for example is taken out from the developing unit, the substrate on which the processing fluid stays is then loaded into the high-pressure processing unit, and a cleaning step, a rinsing step and a drying step are executed in this order.

Since a high molecular contaminant as well, such as a resist and etching polymer adhering to the substrate, is removed during the cleaning step, cleaning is executed with a chemical agent added, considering that a processing fluid comprised merely of a high-pressure fluid such as carbon dioxide has only insufficient cleaning capability. With respect to the chemical agent, a basic compound is preferably used as a cleaning component. This is because a basic compound has a hydrolysis function of high molecular substance which is very often used as a resist, and accordingly achieves effective cleaning. Specific examples of a basic compound are one or more types of compounds selected from a group consisting of quaternary ammonium hydroxide, quaternary ammonium fluoride, alkyl amine, alkanolamine, hydroxyl amine ($NH_2OH$) and ammonium fluoride ($NH_4F$). It is preferable that the cleaning component is contained in the amount of 0.05 through 8 weight percent to the high-pressure fluid. In the preferred embodiment shown in FIG. 1 which uses the high-pressure processing apparatus according to the present invention for the purpose of drying a substrate, xylene, methyl isobutyl ketone, a quaternary ammonium compound, fluorine-containing polymer or the like may be added as a chemical agent depending on the property of a resist which is to be dried.

When the cleaning component such the basic compound as the one described above is not compatible with the high-pressure fluid, it is preferable to use, as a second chemical agent, a compatibilizer which can serve as an auxiliary agent which dissolves or uniformly diffuses the cleaning component in carbon dioxide. The compatibilizer also has a function of preventing re-adhesion of contaminant during the rinsing step which is after completion of the cleaning step.

Figure 8:
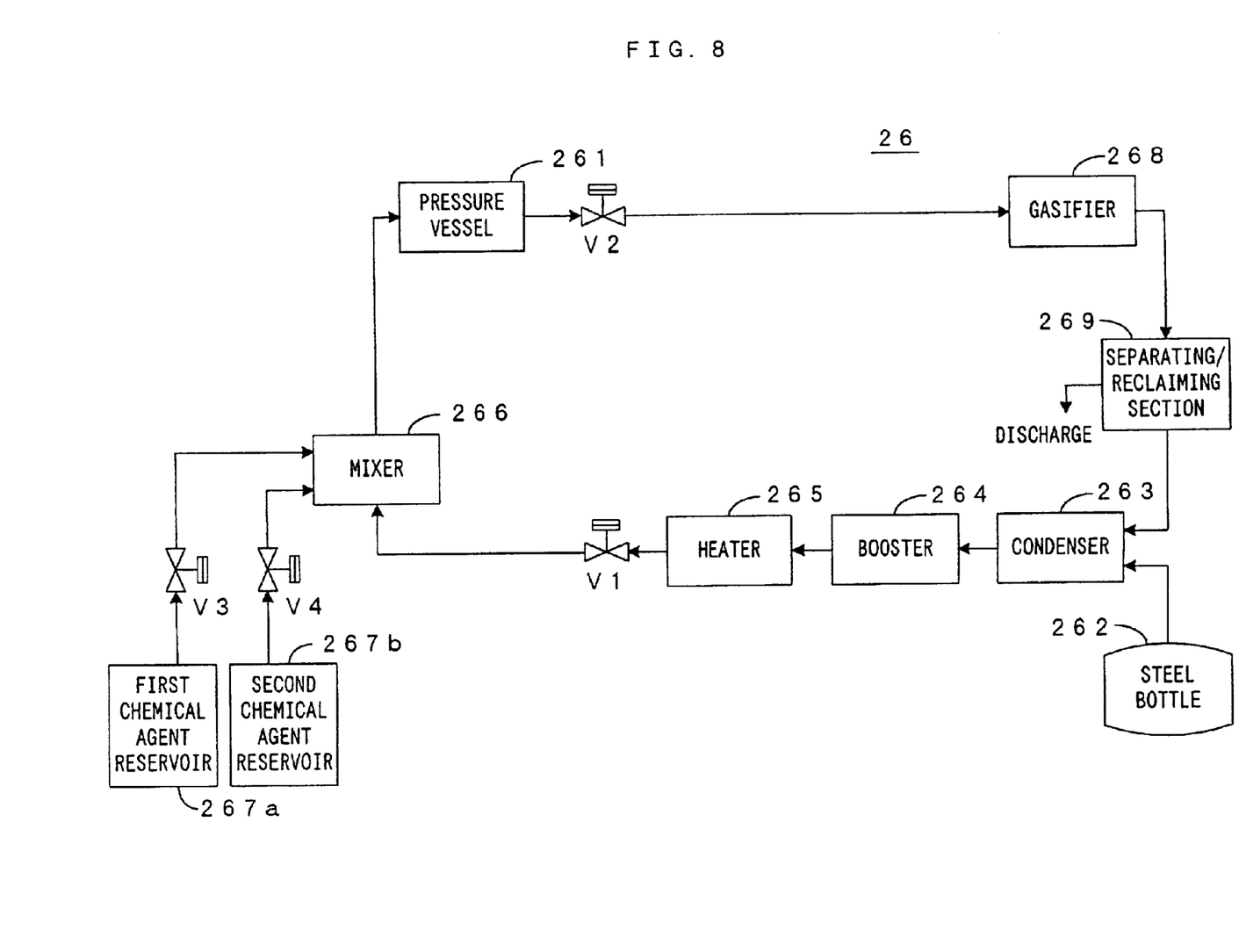
FIG. 8 is a drawing which shows still other preferred embodiment of the substrate processing apparatus according to the present invention.

Although not particularly limited as long as compatibilizing the cleaning component with the high-pressure fluid, the compatibilizer is preferably alcohol such as methanol, ethanol and isopropanol or alkyl sulfoxides such as dimethyl sulfoxide. At the cleaning step, the compatibilizer may be appropriately selected to remain within the range of 10 through 50 percent by mass to the high-pressure fluid. For this reason, in the high-pressure processing unit, a mixer 266 is disposed between the pressure vessel 261 and the high-pressure valve V1 as shown in FIG. 8.

Connected with the mixer 266 are two types of chemical agent reservoirs which store and supply chemical agents which are suitable for surface treatments of the substrates W, namely, a first chemical agent reservoir 267a and a second chemical agent reservoir 267b respectively through high-pressure valves V3 and V4. As the high-pressure valves V3 and V4 are opened and closed under control, a first chemical agent from the first chemical agent reservoir 267a and a second chemical agent from the second chemical agent reservoir 267b are supplied, each in a quantity corresponding to the controlled opening or closing, to the mixer 266, and the quantities of mixing the chemical agents with supercritical carbon dioxide are adjusted. Thus, according to this embodiment, it is possible to selectively prepare "supercritical carbon dioxide," "supercritical carbon dioxide+first chemical agent," "supercritical carbon dioxide+second chemical agent" and "supercritical carbon dioxide+first chemical agent+second chemical agent" as the processing fluid and supply the same to the processing chamber of the pressure vessel 261. Furthermore, with the controller (not shown) controlling the high-pressure valves V3 and V4 to open and close in accordance with the contents of the surface treatments, it is possible to select the type of the processing fluid and control the densities of the chemical agents.

The cleaning process and the rinsing process are executed in the following manner in this high-pressure processing unit. That is, the contaminant which has adhered to the substrate W during the cleaning step is dissolved in the processing fluid which is in the processing chamber (supercritical carbon dioxide+first chemical agent+second chemical agent). Assuming that the first chemical agent is the cleaning component and the second chemical agent is the compatibilizer, since the contaminant has dissolved in supercritical carbon dioxide owing to the actions of the cleaning component (first chemical agent) and the compatibilizer (second chemical agent), there is a possibility that the dissolved contaminant will precipitate if supercritical carbon dioxide alone is allowed to flow in the processing chamber. Hence, it is desirable to execute a first rinsing step, which uses a first rinsing processing fluid comprised of supercritical carbon dioxide and the compatibilizer, and a second rinsing step, which uses a second rinsing processing fluid comprised of only supercritical carbon dioxide, in this order after the cleaning step.

Noting this, this embodiment requires to close the high-pressure valve V3 and accordingly bring the first chemical agent reservoir 267a into a supply stop mode as a predetermined period of time elapses since the start of the supplying of the first and the second chemical agents, i.e., the start of the cleaning step, and thereafter stop the pressure-feeding of the first chemical agent (cleaning component) into the mixer 266 from the first chemical agent reservoir 267a, consequently mix supercritical carbon dioxide with the compatibilizer in the mixer 266 and prepare the first rinsing processing fluid, and supply the first rinsing processing fluid to the processing chamber. At the same time, the high-pressure valve V2 is opened. This allows the first rinsing processing fluid to flow in the processing chamber and the cleaning component and the contaminant within the processing chamber to gradually decrease, eventually leading to a state that the processing chamber is filled up with the first rinsing processing fluid (supercritical carbon dioxide+compatibilizer).

As the first rinsing step is completed, the second rinsing step is carried out. At the second rinsing step, the high-pressure valve V4 is additionally closed to bring the second chemical agent reservoir 267b into the supply stop mode, the pressure-feeding of the second chemical agent (compatibilizer) from the second chemical agent reservoir 267b is stopped, and supercritical carbon dioxide alone is supplied to the processing chamber as the second rinsing processing fluid. The second rinsing processing fluid consequently flows in the processing chamber, and the processing chamber gets filled up with the second rinsing processing fluid (supercritical carbon dioxide).

Following this, the high-pressure valve V1 is closed for decompression, and drying of the substrate W is executed. After the processing chamber returns to the atmospheric pressure, the gate valve disposed in the side surface portion of the pressure vessel 261 is opened. The dedicated transportation robot 27 then unloads the processed substrate W through the gate valve, and the series of processing (cleaning process+first rinsing+second rinsing+drying) completes.

Meanwhile, although the two types of chemical agents are mixed with supercritical carbon dioxide (high-pressure fluid) to prepare the processing fluid in the preferred embodiment described above, the types and the number of the chemical agents and the like may be freely determined. Further, the chemical agent reservoirs are not necessary if a surface treatment is to be performed without using a chemical agent.

In addition, although the cleaning process, the first rinsing process, the second rinsing process and the drying process are executed as surface processing in the preferred embodiment described above, the content of the processing is not limited to this. Rather, a surface treatment to follow the wet surface treatment performed by the wet processing unit may be executed by the high-pressure processing unit.

Third, the present invention is applicable to an apparatus which a substrate already through dry etching for example is taken out from for example is taken out from the cleaning unit, the substrate whose surface is wet with deionized water or an organic solvent is then transported, and the cleaning step, the rinsing step and the drying step are executed in this order in the high-pressure processing unit.

Figure 7:
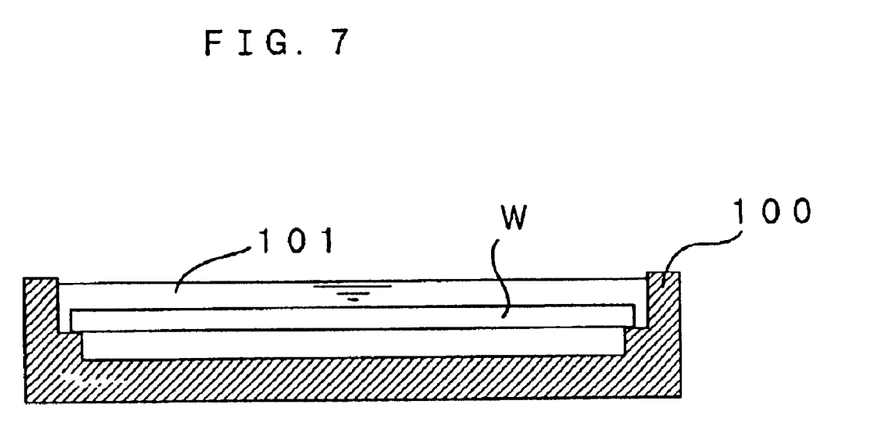
FIG. 7 is a drawing which shows one example of transportation of substrates from a developing unit to a high-pressure processing unit.

Moreover, although the dedicated transportation robot 27, in response to the development process and the rinsing process executed in the developing unit, transports the substrate W wet with the rinsing fluid to the high-pressure processing unit 26 in the preferred embodiment described above, the substrate W may be housed in a transporting container 100 as shown in FIG. 7 and a moisturizing fluid 101 such as deionized water and an organic solvent may be poured into the transporting container 100 so that the substrate having a wet surface is transported. Such a transportation with the transporting container 100 leads to the following merit.

If drying of the substrate W advances during transportation of the substrate W from the wet processing unit to the high-pressure processing unit and the interface between the processing fluid and a gas appears on the substrate W, a problem similar to that associated with spin drying will occur. In other words, if this interface comes to exist between fine patterns formed in the substrate during transportation of the substrate, the surface tension of the rinsing fluid may pull the fine patterns toward each other and accordingly destroy the fine patterns. On the other hand, by transport the substrate W with the transporting container 100 the substrate W is transported as it remains wet to the high-pressure processing unit from the wet processing unit. This prevents destruction of fine patterns formed in the substrate W.

Although the invention has been described with reference to specific embodiments, this description is not meant to be construed in a limiting sense. Various modifications of the disclosed embodiment, as well as other embodiments of the present invention, will become apparent to persons skilled in the art upon reference to the description of the invention. It is therefore contemplated that the appended claims will cover any such modifications or embodiments as fall within the true scope of the invention.

What is claimed is:

1. A substrate processing apparatus including a main transportation path, comprising:
   a wet processing unit which is disposed facing said main transportation path, and which supplies a processing fluid to a substrate to process said substrate with a predetermined wet surface treatment;
   a main transportation system which moves on said main transportation path, and which loads a substrate into and unloads a substrate out from said wet processing unit;
   a high-pressure processing unit which is disposed away from said main transportation path with said wet processing unit located between said main transportation path and said high-pressure processing unit, and which causes a high-pressure fluid or a mixture of a high-pressure fluid and a chemical agent, as a processing fluid, to come into contact with a surface of a substrate treated with said wet surface treatment by said wet processing unit and accordingly processes a surface of said substrate with a high-pressure surface treatment; and
   a dedicated transportation system which is disposed between said wet processing unit and said high-pressure processing unit, and which transports a substrate from said wet processing unit to said high-pressure processing unit.

2. The substrate processing apparatus of claim 1, wherein said main transportation path, said wet processing unit, said dedicated transportation system and said high-pressure processing unit are linearly arranged in this order.

3. The substrate processing apparatus of claim 1, wherein said high-pressure processing unit executes a drying process of drying a substrate as the last process of said surface treatment.

4. The substrate processing apparatus of claim 1, wherein said dedicated transportation system transports said substrate having a wet surface to said high-pressure processing unit.

5. The substrate processing apparatus of claim 4, wherein said dedicated transportation system transports said substrate on which said processing fluid stays.

6. The substrate processing apparatus of claim 4, wherein said dedicated transportation system transports said substrate, which is housed in a transporting container filled with a moisturizing fluid, to said high-pressure processing unit.

7. A substrate processing apparatus including a main transportation path, comprising:
   a plurality of wet processing units each of which is disposed facing said main transportation path, and each of which supplies a processing fluid to a substrate to process said substrate with a predetermined wet surface treatment, one of said wet processing units being a preprocessing unit;
   a main transportation system which moves on said main transportation path, and which loads a substrate into and unloads a substrate out from said wet processing units;
   a high-pressure processing unit which is disposed away from said main transportation path with said preprocessing unit located between said main transportation path and said high-pressure processing unit, and which causes a high-pressure fluid or a mixture of a high-pressure fluid and a chemical agent, as a processing fluid, to come into contact with a surface of a substrate treated with said wet surface treatment by said preprocessing unit and accordingly processes a surface of said substrate with a high-pressure surface treatment; and
   a dedicated transportation system which is disposed between said preprocessing unit and said high-pressure processing unit, and which transports a substrate from said preprocessing unit to said high-pressure processing unit.

8. The substrate processing apparatus of claim 7, wherein said main transportation path, said preprocessing unit, said dedicated transportation system and said high-pressure processing unit are linearly arranged in this order.

9. The substrate processing apparatus of claim 7, wherein said high-pressure processing unit executes a drying process of drying a substrate as the last process of said surface treatment.

10. The substrate processing apparatus of claim 9, wherein said dedicated transportation system transports said substrate on which said processing fluid stays.

11. The substrate processing apparatus of claim 9, wherein said dedicated transportation system transports said substrate, which is housed in a transporting container filled with a moisturizing fluid, to said high-pressure processing unit.

12. The substrate processing apparatus of claim 7, wherein said dedicated transportation system transports said substrate having a wet surface to said high-pressure processing unit.

13. The substrate processing apparatus of claim 7, wherein said high-pressure processing unit uses a supercritical fluid as said processing fluid.

14. The substrate processing apparatus of claim 1, wherein said high-pressure processing unit uses a supercritical fluid as said processing fluid.

15. A substrate processing apparatus including a main transportation path, comprising:

a plurality of wet processing units each of which is disposed facing said main transportation path, and each of which supplies a processing fluid to a substrate to process said substrate with a predetermined wet surface treatment;

a main transportation system which moves on said main transportation path, and which loads a substrate into and unloads a substrate out from said wet processing units;

a plurality of high-pressure processing units each of which is disposed away from said main transportation path with one said wet processing unit located between said main transportation path and said high-pressure processing unit, and each of which causes a high-pressure fluid or a mixture of a high-pressure fluid and a chemical agent, as a processing fluid, to come into contact with a surface of a substrate treated with said wet surface treatment by said one wet processing unit and accordingly processes a surface of said substrate with a high-pressure surface treatment; and a dedicated transportation system which is disposed between said one wet processing unit and the corresponding said high-pressure processing unit, and which transports a substrate from said one wet processing unit to said corresponding high-pressure processing unit, wherein said high-pressure processing units are disposed in juxtaposition.

16. The substrate processing apparatus of claim 15, wherein said main transportation path, said one wet processing unit, said dedicated transportation means and said high-pressure processing unit are linearly arranged in this order.

17. The substrate processing apparatus of claim 15, wherein said high-pressure processing unit executes a drying process of drying a substrate as the last process of said surface treatment.

18. The substrate processing apparatus of claim 15, wherein said dedicated transportation system transports said substrate having a wet surface to said high-pressure processing unit.

19. The substrate processing apparatus of claim 18, wherein said dedicated transportation system transports said substrate on which said processing fluid stays.

20. The substrate processing apparatus of claim 18, wherein said dedicated transportation means transports said substrate, which is housed in a transporting container filled with a moisturizing fluid, to said high-pressure processing unit.

21. The substrate processing apparatus of claim 15, wherein said high-pressure processing unit uses a supercritical fluid as said processing fluid.

* * * * *